United States Patent [19]  [11] 4,355,114
Hang et al.  [45] Oct. 19, 1982

[54] PARTIALLY DEVITRIFIED PORCELAIN CONTAINING BAO.2MGO.2SIO₂ AND 2MGO.B₂O₃ CRYSTALLINE PHASES OBTAINED FROM ALKALI METAL FREE DIVALENT METAL OXIDE BOROSILICATE GLASS

[75] Inventors: Kenneth W. Hang, Princeton Junction; Wayne M. Anderson, Trenton, both of N.J.

[73] Assignee: RCA Corporation, New York, N.Y.

[21] Appl. No.: 242,418

[22] Filed: Mar. 11, 1981

Related U.S. Application Data

[62] Division of Ser. No. 91,091, Nov. 5, 1979, Pat. No. 4,256,796.

[51] Int. Cl.³ .......................... C03C 3/22; C03C 3/10
[52] U.S. Cl. .......................................... 501/5; 501/10; 501/77; 501/79
[58] Field of Search ................. 106/39.6, 39.7, 39.8, 106/54; 501/5, 10

[56] References Cited

U.S. PATENT DOCUMENTS 3,022,179  2/1962  Morrissey ........................... 501/5 X
3,225,132  12/1965  Baas et al. ............................ 501/79
3,225,132  12/1965  Baas et al. ............................ 501/79
3,413,133  11/1968  Stalego ............................. 501/77 X
3,899,340  8/1975  Malmendier ......................... 501/10
3,912,525  10/1975  Monneraye et al. .................. 501/79
4,256,796  3/1981  Hang et al. ......................... 501/5 X

FOREIGN PATENT DOCUMENTS 242803  10/1965  Austria ............................. 501/77
1590777  4/1970  France ............................. 106/54
1251904  11/1971  United Kingdom .

*Primary Examiner*—Helen M. McCarthy
*Attorney, Agent, or Firm*—Birgit E. Morris; Edward J. Sites

[57] ABSTRACT

Partially devitrified porcelain compositions are provided which are comprised of a mixture, based on its oxide content, of barium oxide (BaO), magnesium oxide (MgO) or a mixture of magnesium oxide with certain other oxides (CaO,ZnO), boron trioxide ($B_2O_3$) and slicon dioxide ($SiO_2$). In accordance with this invention the porcelain compositions are applied to the metal core and fired to provide a partially devitrified porcelain coating on the metal core. The coating has a very low viscosity at its initial fusion point and then almost instantaneous high viscosity due to partial devitrification. The fired coating has a deformation temperature of at least 700° C. and a high coefficient of thermal expansion of at least about $110 \times 10^{-7}/°C$.

4 Claims, No Drawings

PARTIALLY DEVITRIFIED PORCELAIN CONTAINING BAO.2MGO.2SIO₂ AND 2MGO.B₂O₃ CRYSTALLINE PHASES OBTAINED FROM ALKALI METAL FREE DIVALENT METAL OXIDE BOROSILICATE GLASS

This is a division, of application serial No. 091,091, filed Nov. 5, 1979, now U.S. Pat. No. 4,256,796.

This invention relates to a new class of partially devitrified porcelain compositions having excellent resistance to deformation at elevated temperatures, high coefficients of thermal expansion, and improved electrical properties. This invention is more particularly concerned with the use of the porcelain compositions to coat metal substrates to provide circuit boards and the like having improved physical and electrical properties which make the circuit boards especially useful as substrates for printed circuits and hybrid circuits having process induced components.

BACKGROUND OF THE INVENTION

In the manufacture of electronic devices it is standard practice to mount or form the various electronic components which comprise the circuits of the devices on a substrate. Various materials have been suggested for use as the substrate, such as organic plastic laminates, metal, porcelain coated steel, and ceramic wafers.

Relatively large circuits such as those employed in radios, televisions, computers and the like are generally produced on organic plastic substrates. The substrates or, as they are more commonly referred to, circuit boards, are typically comprised of a reinforced thermal setting resin. The most widely used type of organic plastic circuit board is comprised of paper reinforced phenolic again. Another widely used type of organic circuit board is glass fabric reinforced epoxy resin laminate.

The organic plastic circuit boards have many advantages. They are relatively inexpensive and can be manufactured in almost any desired size with very flat smooth surfaces. They also have reasonably good physical strength.

The organic plastic circuit boards also have a number of inherent disadvantages which limit the use of this class of circuit boards. They cannot be exposed to high temperatures, that is temperatures in excess of about 400° C. which limits their use to low temperature manufacturing processes. Required conductive metal circuitry and the like must be formed on the surface of the circuit board using low temperature processes such as metal etching or electrical or chemical metal deposition. The electronic components such as capacitors and, more particularly, resistors and the like, must be manufactured as discrete components in separate manufacturing operations and then individually mounted on the organic plastic circuit boards.

The high temperature limitation of the organic plastic circuit boards has become a serious manufacturing problem. New methods have been developed to form electronic components directly on the surface of suitable substrates. These so-called process induced components (PIC) offer certain highly desirable advantages such as being relatively low in cost, simple to form and assemble into circuits, and generally having greater overall improved reliability and electrical accuracy. The materials which are used to form the process induced components are usually prepared in the form of inks which are comprised of metal and glass powder. The inks are printed on the substrate in the desired pattern and the substrate is then fired at elevated temperatures to fuse the materials in the ink and form the desired electronic component. The firing temperatures which are required are generally in the range of 600° to 900° C. or even higher. This is considerably in excess of the upper temperature limits to which the organic plastic circuit boards can be exposed without degradation.

It has been suggested to use various types of ceramic materials as the circuit board, especially where the board will be subjected to high temperatures. A ceramic material which has been employed for this purpose is aluminum oxide wafers. The ceramic materials have excellent high temperature resistance and can be fired and refired many times at temperatures of 600° to 900° C. and even higher without any adverse effects. The ceramics would be ideal substrates for electronic circuits except for the fact that ceramics have certain serious inherent disadvantages, such as being relatively expensive to manufacture and impractical to manufacture in relatively large sizes because of the fragility of the ceramics. This physical size limitation is a serious problem in that a plurality of separate ceramic boards are required where only one organic plastic board would be required. The ceramics also cannot readily be machined or punched to provide mounting apertures and the like required for mounting discrete electronic components. The fragile nature of the ceramic substrates also necessitates the use of mounting fixtures and protective shields to prevent damage to the substrate in use.

Suggestions have also been made in the prior art to use porcelain coated steel as a circuit board. Porcelain coated steel would appear to have a combination of the desirable properties of both the organic plastic circuit boards and the ceramic circuit boards. Porcelain coated steel circuit boards can be made in large sizes similar to the organic plastic boards. Prior to porcelainization, the steel cores of the porcelain coated boards can be easily shaped and apertures can be made in steel boards. The porcelain boards are not subject to thermal degradation at low temperatures, for example 400° C., as are the organic plastic circuit boards. In this respect they are similar to the ceramic circuit boards. The porcelain coated circuit boards are, however, much stronger than the ceramic boards and can be employed in relatively rugged applications.

Porcelain coated metal boards were suggested for use as circuit boards at least as early as the 1930's. However, the porcelain coated boards heretofore known have not proven to be satisfactory. This is especially true with regard to porcelain coated boards which are employed for substrates for process induced components.

One of the principal problems encountered with the prior art porcelain coated steel boards is that when the porcelain is fired it does not fuse into a layer of uniform thickness. Excessive porcelain builds up on the edges of the steel cores in the form of raised lips or ridges. In addition, depending upon the type and conditions used for firing, the porcelain forms as either a meniscus about apertures in the board or forms very thin coatings over edges of the holes. This unevenness in the thickness of the coatings on the surface of the prior art porcelain boards makes it difficult if not impossible to accurately print circuits on the surface of the boards.

A further problem which is encountered is that on refiring at even relatively low temperatures of, for example, 500° to 600° C., the porcelain of the prior art resoftens and reflows. This situation becomes more of a problem if the porcelain is subjected to repeated refiring in that the porcelain continues to reflow on refiring. The movement on reflow of the porcelain coating distorts or even destroys the printed electronic components on the surface of the board.

A still further problem encountered with the porcelain coated metal circuit boards of the prior art is that upon reheating to temperatures even slightly above the softening point of the porcelain, there is often an evolution of gases from the metal core of the substrate. These gases then form bubbles in the porcelain coating which cause shorts between the metal core and components on the surface.

Poor adhesion of the porcelain of the prior art to the metal cores is likewise a very serious problem, especially after repeated high temperature firings. This is believed to be due in part to the substantial differences in the coefficients of thermal expansion of the metal cores and the porcelains of the prior art.

Another problem which is encountered with the porcelain boards of the prior art and which has been a major problem, is known as brown plague. This condition appears to occur with the prior art porcelain boards when an inadvertent electrical contact is made between a conductor on the surface of the board and the metal core of the board. An electrical degradation of the dielectric properties of the porcelain occurs which over a period of time leads to functional failure of the board.

These problems have led to only limited acceptance of porcelain metal boards. It would be highly advantageous if a porcelain coated steel board could be provided which would have the advantages of the organic circuit boards and also the ceramic circuit boards without having the disadvantages noted above of the prior art porcelain coated metal circuit boards.

SUMMARY OF THE INVENTION

It has been found that an improved porcelain coated metal board can be obtained if a suitable metal core is coated with a porcelain composition comprised of a mixture, based on its oxide amount, of magnesium oxide (MgO) or mixtures of magnesium oxide and certain other oxides, barium oxide (BaO), boron trioxide ($B_2O_3$) and silicon dioxide ($SiO_2$). In accordance with this invention the porcelain compositions are applied to the metal core and fired to provide a partially devitrified porcelain coating on the metal core. The coating has a very low viscosity at its initial fusion point and then almost instantaneously obtains a high viscosity due to devitrification. The fired coatings which are preferred for hybrid circuit applications have a deformation temperature of at least 700° C. and a high coefficient of thermal expansion of at least about $110 \times 10^{-7}/°C$.

DETAILED DESCRIPTION OF THE INVENTION

The porcelain compositions of this invention are comprised of four principal oxide components. The four components are barium oxide (BaO) which comprises from about 6 to about 25 mole percent of the composition, magnesium oxide (MgO) or mixtures of magnesium oxide with certain other oxides which comprises about 30 to about 60 mole percent of the composition, boron trioxide ($B_2O_3$) which comprises from about 13 to about 35 mole percent of the composition, and silicon dioxide ($SiO_2$) which comprises from about 10 to about 25 mole percent of the composition.

The compositions of this invention have magnesium oxide as a major component which component is hereinafter referred to as MO. However, when it is desired to even further increase the deformation temperature of the final porcelain or somewhat decrease the coefficient of thermal expansion along with increasing the deformation temperature, it is of advantage to use mixtures of magnesium oxide with other oxides such as zinc oxides or calcium oxides. The composition of MO in these applications should be at least 50 mole percent of magnesium oxide and more preferably 75 mole percent or more, with the remainder of the component MO being the selected added oxide.

Various other oxides and other additives may be incorporated into the porcelain compositions of this invention to alter or to improve selected properties of the porcelain for certain applications. Colorants such as the oxides of cobalt, manganese, nickel or chromium can be added if desired. Certain crystal control agents such as aluminum oxide ($Al_2O_3$), phosphorous pentoxide ($P_2O_5$), zirconium oxide ($ZrO_2$) and stannic oxide ($SnO_2$) can be added to adjust the size and rate of crystallization. The additives of the type noted above can be included in the compositions of this invention in amounts up to about 3 mole percent of the composition.

In order to obtain the maximum benefits of this invention it is important that the amount of alkali metal oxides, particularly sodium oxide, be minimized, as these alkali metal materials can have a marked adverse effect on the dielectric properties of the porcelain. This is believed to be due in part to alkali metal ion migration to the surface of the porcelain. Certain amounts of the alkali metal oxide, however, may be added as minor impurities along with other components.

The initial step in the preparation of the porcelains of this invention is to prepare a glass frit having the desired composition.

The raw materials which are used in the preparation of the glass frit can be of commercial glass-making quality. The raw materials should be free of any impurities which will adversely affect the quality of the final porcelain. Particular attention should be directed to the amount, if any, of alkali metal impurities in the raw materials.

The raw materials can be the specific oxide required or a material which upon heating to the melting temperature employed in the glass making process (1400° to 1500° C.) will be converted to the desired oxide. Examples of the latter material include magnesium carbonate and barium carbonate. The raw materials are weighed out based on their oxide content and the components are blended together. To ensure that a homogeneous mixture is employed in the glass melting process it is preferable to pelletize the mixed components at this point. In order to facilitate further processing steps the mixture of materials should also be heat treated to remove any moisture. The mixture is then melted using conventional glass melting techniques. The raw materials are gradually heated to about 1400° to 1500° C. and then the resultant molten mass is maintained at this temperature until a homogeneous melt is obtained. Typically, it has been found that a melt time of about one hour is sufficient depending upon the equipment and amount of material employed.

The next step in the process is to convert the molten glass mass into a glass frit. Various well known methods can be employed for this process. It has been found that for the purpose of this invention it is preferable to pour the molten stream of glass over a set of spaced apart counter revolving water chilled rollers to provide a thin ribbon of solidified glass. The solidified glass ribbon is then crushed and the resulting particles are placed in a ball mill and dry milled with a grinding media until the particles are substantially uniform in size.

Then the dried milled glass particles are subjected to a second grinding. This time a lower aliphatic alcohol having 3-10 carbon atoms, preferably isopropyl alcohol, is added to the ball mill in an amount sufficient to form a slurry with the glass particles. The alcohol should be substantially water free to prevent undesirable hydration of the glass particles during this process. The slurry is tumbled in the ball mill with a grinding media for about 8 to 12 hours until the particle size of the glass is reduced to between 3 and 5 microns. The slurry is removed from the ball mill and additional alcohol is added to dilute the slurry from between 10 and 50 weight percent of glass frit. This suspension is the stock solution used in subsequent porcelainization steps.

The glass frit of this invention can advantageously be used to form coatings of the porcelain of this invention on various types of metal structures. The porcelain of this invention is especially useful as coatings for electrical apparatus which require a high degree of performance and reliability under adverse conditions.

The porcelain is especially useful in the manufacture of circuit boards which are subjected to high temperatures.

To form the porcelain coated metal article, a metal core or substrate is initially prepared for the porcelainization. The metals which are used as the core can be comprised of various metals, metal alloys or can be a composite metal structure having, for example, a metal body of a first metal having a plating on the surface of a second metal on which the porcelain is applied. These include for example copper, stainless steel and most preferably low carbon steel metal cores. In order to obtain the optimum and most uniform electrical properties it is preferable to select metallic materials having as fine a crystalline grain structure in the metal as possible.

The metal core is cut, formed or otherwise shaped into a desired configuration required for the final application. Any required apertures, mounting holes or the like are formed in the metal core by conventional metal working techniques. At this point it is preferable to remove all burrs, sharp edges or the like from the metal to facilitate the later coating with the porcelain.

The metal core is then washed, degreased and the like to remove all foreign materials from the surface of the metal. The metal is then etched with a ferric ion solution and given a flash of metal such as nickel or cobalt to assist in the adhesion of the porcelain to the metal.

The metal core is then coated with a suspension of the glass frit. The preferred method of coating in accordance with this invention is by electrophoretic deposition. In this process the alcohol suspension prepared as noted above is placed in a suitable electrolytic tank. Nickel or stainless steel bars are used as the anodes. The metal part to be coated is placed in the cathode position. Electric current is conducted through the bath in a conventional manner. The glass particles in the suspension deposit on the surface of the metal article. The thickness of the coating on the metal core is dependent on the deposition efficiency of the slurry and the time of deposition. When the desired amount of glass particles is deposited on the metal core, the core is removed from the glass frit bath and the alcohol is allowed to drain from the coated article. The coated article is then placed in a forced air oven at about 100° C. until dry. The coated article when removed from the oven will have a uniform thickness coating of glass frit over the surface. The coating will be of the same thickness about the edges of the board and through and around apertures in the board.

The glass frit coated article is now ready for firing. The firing procedure is important in order to obtain the desired form of porcelain. The glass frit coated article is placed directly into a firing chamber which is maintained at a temperature of at least 750° C. and more preferably 800° to 850° C. The initial temperature of firing must be sufficiently high that there is a rapid sintering and substantially simultaneous devitrification. The 750° C. temperature is generally sufficient for this purpose. It has been found, however, that the higher temperatures, for example the 800° to 850° C., permit even more rapid devitrification and generally result in a better quality porcelain. The fired sample is retained in the firing chamber until there is substantially completion of the devitrification reaction. This time is dependent on the firing temperature employed. Lower temperatures, for example 750° C., require longer firing, typically 15-30 minutes, while at higher temperatures, for example 840° C., satisfactory results can be obtained in 5 minutes or less.

Temperatures in excess of 800° to 850° C. are generally not required for firing of the porcelain and can have an adverse effect on the metal core. Extended exposure to elevated temperatures in excess of 800° to 850° C. can cause certain metals, particularly low carbon steels, to undergo a transformation from a fine grain crystalline structure to a coarse grain crystalline structure. This transformation can adversely affect the physical strength and the electrical properties of the final article.

The glass frit coating undergoes a rapid change as it is fired. There is a sintering of the glass particle of the frit to a low viscosity melt and then almost simultaneous devitrification to a very high viscosity. This can be readily observed visually during the initial firing as the coating will become continuous and assume a smooth exterior appearance and almost immediately acquire a flat matte-like appearance. In comparison, the conventional porcelain frits heretofore suggested for electrical application convert to a shiny, glass-like state and remain in this state.

There is sufficient initial flow for leveling but essentially no extensive flow of material on the surface. As a result of the rapid increase in viscosity there is no substantial change in the uniformity of the thickness on the coating of the metal core. The finished fired porcelain will have the same relative uniform thickness layer on the surface and about the holes as the glass frit coating.

The fired porcelain has been found to contain between about 50 and 90 volume percent of crystalline material with the remainder of the composition being comprised of a vitreous glass. The proportion of the crystalline material and vitreous glass is dependent upon both the composition of the frit employed and to some extent the firing conditions utilized.

The crystalline portion of the porcelain is comprised of two types of crystalline material. The primary crystal phase is of the formula $BaO.2MO.2SiO_2$ and the second crystalline material is of the formula $2MO.B_2O_3$ wherein MO has the same meaning as above. When the preferred raw materials are used to form the glass frit, that is, when MO is magnesium oxide, the crystal phases will be respectively $BaO.2MgO.2SiO_2$ and $2MgO.B_2O_3$.

The glassy vitreous material is an amorphous composition comprised of the remainder of the materials included in the starting formulation.

The final porcelain of this invention is further characterized by having a deformation temperature underload of at least 700° C. The deformation test is conducted by placing a fired sample in an oven and gradually heating the fired sample while maintaining a static load on the sample surface of about 10 KG per/cm². The temperature at which the coating on the sample deforms under load is taken as the deformation temperature. It is possible to refire the porcelains at even higher temperatures without any distortion of the porcelain if the porcelain surface is not subjected to a load.

The fired porcelain coatings of this invention are further characterized by having high coefficients of thermal expansion. The compositions typically have coefficients of thermal expansion of $110 \times 10^{-7}/°C.$ and even higher, taken over the range from about 0° C. to about the deformation temperature of the given porcelain. The high coefficient of thermal expansion is an important feature of the porcelains of this invention. The porcelains can be selected to have coefficients of expansion up to substantially the same as the metal cores employed. If the coefficients of expansion of the porcelain and the metal core are substantially the same, the result is a reduced tendency for the porcelain to fracture on the core, especially after repeated refirings.

The porcelain coated circuit boards produced in accordance with this invention are especially useful in the manufacture of process induced components used in hybrid circuits.

The porcelain coated circuit boards of this invention have flat surfaces and, accordingly, can be easily and accurately printed. The boards can then be fired and repeatedly refired at temperatures typically up to 800° to 850° C. or even 1000° C. as required to fuse the printed-on indicia into the desired process induced electronic components. Adhesion of the process induced components has been found to be excellent, especially after repeated firings.

A highly unexpected advantage of the porcelains of this invention is that they exhibit no tendency to be affected by brown plague. When circuits are applied to the surface of the board and contact is made between the component on the surface and the metal core, there is no development of brown plague.

The porcelains of this invention also have improved electrical properties. It has been found that there is essentially no migration of ions within the porcelain similar to that found with the alkali metal containing porcelains of the prior art. This results in the porcelains of this invention having exceptionally stable characteristics with regard to the long range electrical properties.

A still further advantage of the porcelains of this invention is that they exhibit substantially higher breakdown voltages than the porcelains heretofore employed in the prior art. The breakdown voltages of the porcelains of this invention are superior in both high temperature applications and high voltage applications in comparison to prior art porcelains.

The following examples are given by way of further illustration of this invention and are not intended to limit the scope of the invention beyond that of the attached claims. The compositions described therein are given by mole percent unless otherwise indicated.

EXAMPLES 1-34

A series of porcelains were prepared using various combinations of oxide materials. Each of the examples were initially formed as glass frits. The glass frits were applied to low carbon steel substrates and the samples were fired as noted in the chart. The compositions and the results are set forth in the chart below.

| Example | MgO | BaO | Other | $B_2O_3$ | $SiO_2$ | Heat Treatment | Temp. Range | Coeff. Thermal Expansion | Deform. Temp. |
|---|---|---|---|---|---|---|---|---|---|
| 1 | 46.7 | 15.0 | | 23.3 | 12.0 | 750° C.—35 min. | 0–800° C. | $122.9 \times 10^{-7}/°C.$ | 833° C. |
| 2 | 35.0 | 20.0 | | 25.0 | 20.0 | 750° C.—15 min. | 0–750° C. | $142.8 \times 10^{-7}/°C.$ | 770° C. |
| 3 | 30.0 | 17.5 | | 35.0 | 17.5 | 750° C.—15 min. | 0–600° C. | $82.7 \times 10^{-7}/°C.$ | 620° C. |
| 4 | 44.0 | 14.0 | | 28.0 | 14.0 | 750° C.—15 min. | 0–600° C. | $102.5 \times 10^{-7}/°C.$ | 620° C. |
| 5 | 42.0 | 20.0 | | 18.0 | 20.0 | 750° C.—30 min. | 0–800° C. | $135.4 \times 10^{-7}/°C.$ | 806° C. |
| 6 | 45.0 | 15.0 | | 20.0 | 20.0 | 840° C.—3 min. | 0–588° C. | $102.6 \times 10^{-7}/°C.$ | 634° C. |
| 7 | 42.0 | 15.0 | | 18.0 | 25.0 | 750° C.—30 min. | 0–600° C. | $94.2 \times 10^{-7}/°C.$ | 647° C. |
| 8 | 45.0 | 17.5 | | 20.0 | 17.5 | 750° C.—10 min. | 0–750° C. | $123.9 \times 10^{-7}/°C.$ | 855° C. |
| 9 | 43.0 | 21.0 | | 15.0 | 21.0 | 750° C.—10 min. | 0–750° C. | $125.4 \times 10^{-7}/°C.$ | 770° C. |
| 10 | 47.5 | 16.1 | | 15.0 | 21.4 | 830° C.—5 min. | 0–750° C. | $110.3 \times 10^{-7}/°C.$ | 780° C. |
| 11 | 47.5 | 18.7 | | 15.0 | 18.7 | 750° C.—10 min. | 0–750° C. | $135.6 \times 10^{-7}/°C.$ | 770° C. |
| 12 | 35.0 | 25.0 | | 15.0 | 25.0 | 750° C.—10 min. | 0–750° C. | $146.8 \times 10^{-7}/°C.$ | 760° C. |
| 13 | 41.6 | 19.8 | .120[4] .726[6] | 17.8 | 19.8 | 750° C.—10 min. | 0–750° C. | $134.3 \times 10^{-7}/°C.$ | 770° C. |
| 14 | 47.0 | 16.5 | | 20.0 | 16.5 | 840° C.—5 min. | 0–800° C. | $139.8 \times 10^{-7}/°C.$ | 836° C. |
| 15 | 50.0 | 15.0 | | 20.0 | 15.0 | 830° C.—5 min. | 0–750° C. | $127.7 \times 10^{-7}/°C.$ | 777° C. |
| 16 | 46.4 | 16.3 | .139[4] 1.16[5] | 19.7 | 16.3 | 840° C.—5 min. | 0–750° C. | $133.2 \times 10^{-7}/°C.$ | 816° C. |
| 17 | 42.0 | 16.5 | 5.0[1] | 20.0 | 16.5 | 840° C.—5 min. | 0–800° C. | $138.3 \times 10^{-7}/°C.$ | 821° C. |
| 18 | 49.0 | 10.0 | 5.0[1] | 21.0 | 15.0 | 830° C.—5 min. | 0–861° C. | $128.1 \times 10^{-7}/°C.$ | 937° C. |
| 19 | 45.0 | 16.0 | 3.0[3] | 20.0 | 16.0 | 840° C.—5 min. | 0–578° C. | $97.6 \times 10^{-7}/°C.$ | 627° C. |
| 20 | 46.0 | 18.0 | | 18.0 | 18.0 | 840° C.—5 min. | 0–750° C. | $131.8 \times 10^{-7}/°C.$ | 780° C. |
| 21 | 53.0 | 12.5 | | 22.0 | 12.5 | 840° C.—5 min. | 0–750° C. | $128.7 \times 10^{-7}/°C.$ | 840° C. |
| 22 | 47.0 | 16.5 | | | 16.5 | 840° C.—5 min. | 0–800° C. | $141.2 \times 10^{-7}/°C.$ | 831° C. |
| 23 | 45.6 | 16.0 | 3.0[2] | 16.0 | 19.4 | 830° C.—5 min. | 0–800° C. | $135.9 \times 10^{-7}/°C.$ | 857° C. |
| 24 | 46.3 | 16.2 | 1.5[3] | 16.2 | 19.7 | 850° C.—5 min. | 0–828° C. | $136.5 \times 10^{-7}/°C.$ | 870° C. |
| 25 | 47.0 | 16.5 | | 16.5 | 20.0 | 830° C.—5 min. | 0–608° C. | $105.4 \times 10^{-7}/°C.$ | 649° C. |
| 26 | 42.0 | 16.5 | | 16.5 | 25.0 | 830° C.—5 min. | 0–828° C. | $117.9 \times 10^{-7}/°C.$ | 835° C. |
| 27 | 45.0 | 15.0 | | 15.0 | 25.0 | 830° C.—5 min. | 0–889° C. | $112.1 \times 10^{-7}/°C.$ | 890° C. |

-continued

| Example | MgO | BaO | Other | $B_2O_3$ | $SiO_2$ | Heat Treatment | Temp. Range | Coeff. Thermal Expansion | Deform. Temp. |
|---|---|---|---|---|---|---|---|---|---|
| 28 | 47.0 | 11.5 | 5.0[1] | 16.5 | 20.0 | 830° C.—5 min. | 0–950° C. | $116.9 \times 10^{-7}$/°C. | 970° C. |
| 29 | 46.0 | 10.0 | 8.0[1] | 21.0 | 15.0 | 830° C.—5 min. | 0–800° C. | $126.3 \times 10^{-7}$/°C. | 861° C. |
| 30 | 49.0 | 10.0 | 5.0[1] | 19.0 | 17.0 | 830° C.—5 min. | 0–584° C. | $117.8 \times 10^{-7}$/°C. | 593° C. |
| 31 | 49.0 | 7.0 | 8.0[1] | 21.0 | 15.0 | 830° C.—5 min. | 0–897° C. | $120.5 \times 10^{-7}$/°C. | 980° C. |
| 32 | 52.0 | 7.0 | 5.0[1] | 21.0 | 15.0 | 830° C.—5 min. | 0–906° C. | $119.9 \times 10^{-7}$/°C. | 990° C. |
| 33 | 57.0 | 7.0 |  | 21.0 | 15.0 | 830° C.—5 min. | 0–915° C. | $125.0 \times 10^{-7}$/°C. | 1000° C. |
| 34 | 51.0 | 7.0 | 8.0[1] | 20.0 | 14.0 | 830° C.—5 min. | 0–889° C. | $148.2 \times 10^{-7}$/°C. | 924° C. |

[1] ZnO
[2] $ZrO_2$
[3] $P_2O_5$
[4] $Co_3O_4$
[5] $MnO_2$
[6] NiO

The porcelains produced in accordance with the above examples can be used with the various types of circuits noted above. Those porcelains having deformation temperatures above 700° C. and even higher are especially useful in the manufacture of circuits having process induced components which require high temperature firing. Certain of the others of the porcelains having somewhat lower deformation temperatures are more preferably used as substrates for conventional printed circuits, and as substrates on which discrete electronic components are mounted.

EXAMPLE 35

To determine the effect of firing time on the properties of the final porcelain two samples were prepared for firing with the same composition but were fired for different times.

The glass frit which was used was comprised of 42 mole percent magnesium oxide, 20.0 mole percent barium oxide, 18.0 mole percent boron trioxide and 20.0 mole percent silicon dioxide.

The following results were obtained:

| Firing Conditions | | Coefficient of Thermal Expansion | Deformation Temperature |
|---|---|---|---|
| Time | Temperature | | |
| 3 min. | 750° C. | $132.0 \times 10^{-7}$/°C. | 510° C. |
| 30 min. | 750° C. | $135.4 \times 10^{-7}$/°C. | 806° C. |

EXAMPLE 36

The dielectric properties and, in particular, the dielectric breakdown voltage of a porcelain of this invention and that of two commercially sold porcelain coated boards were determined.

In this test the effect of temperature was determined by raising the temperature while attempting to maintain the voltage constant. The following results were obtained.

| Type of Porcelain | Contact Area | Enamel Thickness | Breakdown Temperature | Breakdown Voltage |
|---|---|---|---|---|
| Control A (commercial) | 1 in² | 7 mil | 150° C. | 3000V dc |
| Control B (commercial) | 1 in² | 7 mil | 325° C. | 3000V dc |
| Example 16 | 1 in² | 7 mil | 500° C. | 3500V dc |

EXAMPLE 37

Example 36 was repeated except that the temperature was held constant and voltage was increased to breakdown. The results were as follows:

| Type of Porcelain | Contact Area | Enamel Thickness | Temperature | Average Breakdown Voltage |
|---|---|---|---|---|
| Control A (commercial) | 1 in² | 7 mil | 150° C. | 3000V dc |
| Control B (commercial) | 1 in² | 7 mil | 150° C. | 4500V dc |
| Example 16 | 1 in² | 7 mil | 150° C. | 9000V dc |

What is claimed is:

1. A partially devitrified porcelain which is free to substantially free of alkali metal oxide, said porcelain having an oxide composition consisting essentially of:
   (a) from about 6 to about 25 mole percent of barium oxide;
   (b) from about 30 to about 60 mole percent of MO wherein MO is a member selected from the group consisting of magnesium oxide and mixtures comprised of at least 50–70 mole percent of magnesium oxide with the remainder being at least one member selected from the group consisting of zinc oxide and calcium oxide;
   (c) from about 13 to about 35 mole percent of $B_2O_3$; and
   (d) from about 10 to about 25 mole percent of $SiO_2$ with about 50 to 90 volume percent of said partially devitrified porcelain being in a crystalline state and the remainder being in the state of a vitreous glass, wherein the principal crystalline phases are crystals of a first and second type, said first crystal being of the composition $BaO.2MgO.2SiO_2$ and said second crystal being of the composition $2MgO.B_2O_3$.

2. The devitrified porcelain according to claim 1 having a deformation temperature of at least 700° C.

3. The devitrified porcelain according to claim 1 wherein said porcelain has a thermal coefficient of expansion greater than $110 \times 10^{-7}$/°C.

4. The partially devitrified porcelain of claim 1 wherein MO is magnesium oxide.

* * * * *